(12) United States Patent
Chavali

(10) Patent No.: US 11,004,792 B2
(45) Date of Patent: May 11, 2021

(54) MICROELECTRONIC DEVICE INCLUDING FIBER-CONTAINING BUILD-UP LAYERS

(71) Applicant: Intel Corporation, Santa Clara, CA (US)

(72) Inventor: Sri Chaitra Jyotsna Chavali, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/145,804

(22) Filed: Sep. 28, 2018

(65) Prior Publication Data
US 2020/0105674 A1 Apr. 2, 2020

(51) Int. Cl.
| | |
|---|---|
| *H01L 23/532* | (2006.01) |
| *H01L 23/538* | (2006.01) |
| *H01L 23/00* | (2006.01) |
| *H01L 23/373* | (2006.01) |
| *H01L 23/492* | (2006.01) |

(52) U.S. Cl.
CPC ...... *H01L 23/5329* (2013.01); *H01L 23/5383* (2013.01); *H01L 23/5389* (2013.01); *H01L 24/17* (2013.01); *H01L 23/3733* (2013.01); *H01L 23/4922* (2013.01); *H01L 2224/05599* (2013.01); *H01L 2224/86399* (2013.01)

(58) Field of Classification Search
CPC ............. H01L 23/5329; H01L 23/5389; H01L 23/5383; H01L 24/17; H01L 2224/05599; H01L 2224/86399; H01L 23/3733; H01L 23/4922
See application file for complete search history.

(56) References Cited

U.S. PATENT DOCUMENTS

| | | | |
|---|---|---|---|
| 6,136,733 A | 10/2000 | Blumberg et al. | |
| 6,387,830 B1 | 5/2002 | Blumberg et al. | |
| 6,657,275 B1 | 12/2003 | Chung et al. | |
| 6,787,895 B1* | 9/2004 | Jarcy | H01L 21/568 174/252 |
| 6,841,026 B2 | 1/2005 | Blumberg et al. | |
| 6,929,848 B2 | 8/2005 | Samuels et al. | |
| 7,602,062 B1 | 10/2009 | Wang | |
| 8,264,849 B2 | 9/2012 | Guzek | |
| 9,613,915 B2 | 4/2017 | Lamorey et al. | |
| 2006/0054870 A1 | 3/2006 | Japp et al. | |
| 2010/0200663 A1* | 8/2010 | Dozen | H01L 27/1214 235/492 |

(Continued)

FOREIGN PATENT DOCUMENTS

| | | |
|---|---|---|
| CN | 103465436 B | 11/2015 |
| JP | 5145626 B2 | 12/2012 |

(Continued)

*Primary Examiner* — Patricia D Reddington
(74) *Attorney, Agent, or Firm* — Schwegman Lundberg & Woessner, P.A.

(57) ABSTRACT

Described are microelectronic devices including a substrate formed with multiple build-up layers, and having at least one build-up layer formed of a fiber-containing material. A substrate can include a buildup layers surrounding an embedded die, or outward of the build-up layer surrounding the embedded die that includes a fiber-containing dielectric. Multiple build-up layers located inward from a layer formed of a fiber-containing dielectric will be formed of a fiber-free dielectric.

18 Claims, 7 Drawing Sheets

(56) References Cited

U.S. PATENT DOCUMENTS

| | | | |
|---|---|---|---|
| 2011/0018145 A1* | 1/2011 | Salama | H01L 23/49894 |
| | | | 257/786 |
| 2011/0031606 A1 | 2/2011 | Chen et al. | |
| 2013/0062099 A1* | 3/2013 | Hunrath | H05K 3/4069 |
| | | | 174/251 |
| 2014/0102765 A1 | 4/2014 | Hurwitz et al. | |
| 2014/0124944 A1 | 5/2014 | Zhang et al. | |
| 2014/0376195 A1 | 12/2014 | Zhang et al. | |
| 2016/0181145 A1 | 6/2016 | Hossain et al. | |

FOREIGN PATENT DOCUMENTS

| | | |
|---|---|---|
| JP | 6303320 B2 | 3/2018 |
| WO | WO-2014136773 A1 | 9/2014 |

* cited by examiner

MICROELECTRONIC DEVICE INCLUDING FIBER-CONTAINING BUILD-UP LAYERS

TECHNICAL FIELD

Embodiments described herein relate generally to methods and apparatus for forming microelectronic devices and the composition of build-up layers used in forming such devices, and more particularly relate to the configuration and forming of substrates resistant to cracking or delamination, including embedded die substrates, through use of multiple build-up layers of which selected build-up layers include a fiber-containing build-up dielectric.

BACKGROUND

Many forms of microelectronic devices, such as IC (integrated circuit) packages, include a substrate structures (including, for example, semiconductor substrates, interposers, redistribution layers, ("RDLs"), supporting or connecting to one or more semiconductor devices (referred to herein as "die"). The term "substrate" is used herein to refer generically to all of such identified substrate structures. Such substrates also include substrate in which a semiconductor die is retained on one or more surfaces of the substrate, with one or more "embedded die" retained at least partially beneath a surface of the substrate. Such embedded die can, in some examples, be passive (or "bridge") die interconnecting two or more die attached at the surface of the substrate; in some examples providing relatively high-speed and high-density interconnections between the surface die. In other examples, the embedded die may be "active," including additional functionality beyond such interconnections. Such substrates, including embedded die substrates, are typically formed of multiple build-up layers, with each build-up layer including a dielectric, with conductive structures extending over the dielectric and forming contacts through the dielectric to an underlying conductive structure (such as another conductive layer, contact pad layer, through core contact, etc.). Embedded die substrates offer significant advantages in forming microelectronic devices integrating multiple individual die into a space-efficient assembly. But embedded die substrates can in some instances present challenges in assuring that all build-up layers remain uniformly attached to one another, such as under conditions presenting thermal or mechanical stress to the substrate. Even for substrates without embedded die, attachments to external die or other structures can present challenges to the structural integrity of the substrate. These challenges are increased for microelectronic devices intended for use in relatively hostile environments, such as for example, in mobile environments where high-temperature and/or vibration may be encountered.

BRIEF DESCRIPTION OF THE DRAWINGS

FIGS. 1A-1B depict simplified cross-sectional representations of an example microelectronic device including an embedded die substrate; wherein FIG. 1A depicts a cross-sectional representation of an example portion of the substrate incorporating an embedded die; and wherein FIG. 1B depicts the embedded die substrate of FIG. 1A, with a surface die and an additional component attached to the substrate.

DESCRIPTION OF EMBODIMENTS

Figure 1A:
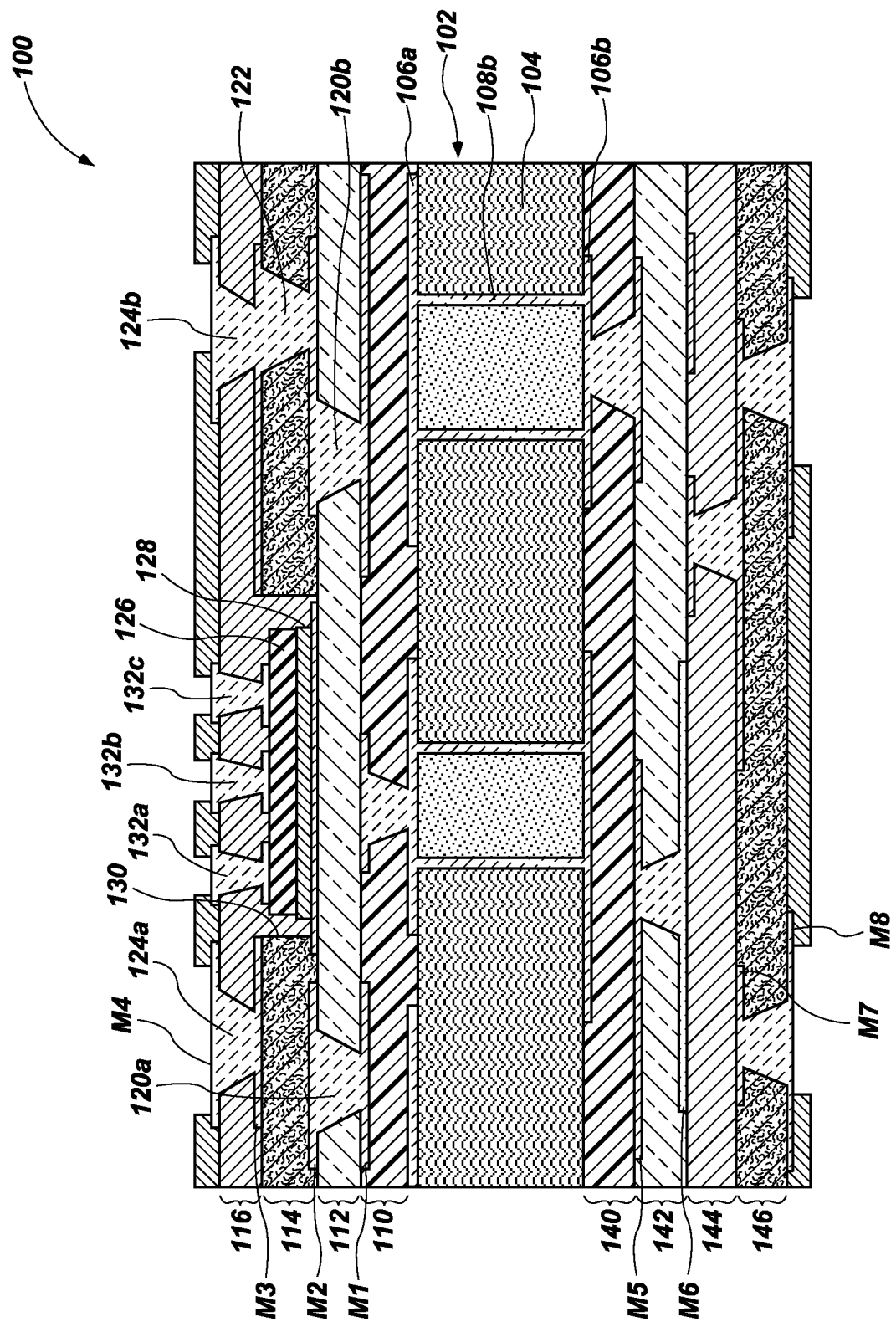

The following description and the drawings sufficiently illustrate specific example embodiments to enable those skilled in the art to practice the embodiments. Other embodiments may incorporate structural, logical, electrical, process, and other changes. Portions and features of some embodiments may be included in, or substituted for, those of other embodiments. Embodiments set forth in the claims encompass all available equivalents of those claims.

Described herein are example microelectronic devices incorporating substrates, in some cases embedded die substrates, configured to resist failures, such as cracking or delamination, which can occur, for example, particularly when the devices are subjected to thermal or mechanical stresses. For example, thermal stresses can result in cracking or flexing of one or more build-up layers of the substrate. Such thermal stresses can arise at least in part from operating environments in which the substrate is exposed to relatively high temperatures. For example, in some automotive environments, under hood temperatures can reach as high as 150° C., though much lower temperatures, for example in the vicinity of 40° C. or higher, can be problematic in some instances. In some cases, an embedded die itself can be a source of localized heat causing thermal stress to nearby material layers. In other cases, vibration and other mechanical stresses can induce cracking or flexing of build-up layers particularly those build-up layers surrounding or extending above an embedded die in a substrate.

Example embodiments of embedded die substrates discussed herein incorporate multiple build-up layers, in which at least one layer of a build-up layer surrounding around an embedded die, and a build-up layer located outward of the build-up layer surrounding the embedded die, includes a fiber-containing dielectric; and in which multiple build-up layers located inward from the build-up layer surrounding the embedded die include a dielectric without fibers. In most cases, the embedded die will be retained within a closed horizontal recess in a "surrounding" build-up layer in which it is housed. For purposes of the present description, the term "outward" refers to a build-up layer closer to a nearest adjacent exterior surface of the substrate being formed than the build-up layer surrounding the embedded die; and the term "inward" refers to build-up layers to the opposite side of a build-up layer supporting surrounding the embedded die. For example, in the case of a cored substrate, the "inward" layers will be closer to the core than the build-up layer supporting the embedded die.

The fiber-containing dielectric can be selected of a variety of materials and configurations. For example, the fiber-containing dielectric material can be selected for desired properties, including Young's modulus, and a suitable coefficient of thermal expansion ("CTE"), and also having appropriate characteristics such as minimum line space ("L/S") capability, and processing requirements, etc. for the application at issue. The fibers in such build-up dielectric materials can be of various forms. In many examples, the fibers may be glass fibers (such as by way of example only, one of various grades of E-glass ("Electrical Grade Glass") or S-Glass ("Stiff Grade Glass") known in the industry); and the fibers may be present as a woven structure (in various forms known in the industry) or as individual filaments. In other examples, other forms of fibers, such as quartz or aramid fibers may be utilized.

Example fiber-containing dielectric materials that can be used in accordance with the structures described herein include: "prepreg," which includes a higher filler content dielectric resins impregnated with glass fibers; and "build-up ["BU"] with glass cloth" ("BU-GC"). Example prepreg materials that can be used with selected embodiments as identified herein include, but are not limited to, Hitachi GEA679FGR, and Mitsubishi HL-830NSF. Examples of BU-GC dielectric materials that can be used in accordance with any of the embodiments described herein, include build-up dielectric materials marketed under the designators GXT31-GCP and GX92-GCP, manufactured by Ajinomoto Co., Inc.

In some examples, use of prepreg dielectric can limit the contact and line spacing that may be patterned in the layer, and thus can only be used in layers where relatively tight line spacing is not required. For example, with current prepreg dielectric build-up materials, the minimum line spacing will be approximately 14/18LS for a copper thickness of 15 microns. When prepreg is utilized in forming an embedded die substrate, contacts and conductive lines formed in the prepreg build-up layer may be placed at a first minimum pitch, and electrical contacts to the embedded die may need to be placed at a second minimum pitch which is smaller than the first minimum pitch. As a result, to accommodate this disparity, build-up layer materials extending directly over the embedded die, can be formed without fibers. In some examples, such fiber-free dielectric materials can be part of an outward build-up layer that is fiber-free, or can be a fill material extending through a fill recess in one or more fiber-containing build-up layers in a localized region above the embedded die. As will be apparent to persons skilled in the art, while the fiber-free dielectric materials will be absent of fibers, such materials used in forming build-up layers commonly have other non-fibrous fillers, such as silica, etc.

Other constraints on use of prepreg build-up dielectric materials can be processing temperatures and pressures. Such prepreg build-up materials are typically hot pressed at high temperatures during processing. In general, some prepreg build-up materials are commonly cured through a "hot press" process at a temperature generally around 250° C. for about 90 minutes, at relatively high pressures. As a result, in some applications in which prepreg material is used for relatively outward layers of a substrate, these conditions can cause layers inward of the prepreg material to heat beyond their glass transition temperature (Tg), resulting in embrittling of the substrate. As a result, such the build-up material used for such inward layers must be selected in view of the necessary Tg to avoid this problem. In general, such relatively high Tg dielectric materials can provide patternability constraints. Notwithstanding these considerations, prepreg dielectric materials are commonly used, and may be suitable for various specific implementations such as the examples described herein.

In contrast to these characteristics of conventional prepreg build-up dielectric materials, BU-GC materials, such as the example products identified above, do not provide such constraints. For example, many BU-GC materials offer patternability comparable to fiber-free build-up layers. Such fiber-free build-up materials (which include various materials known as "Ajinomoto Build-up Film" ("ABF")) are well-known in the industry. For example, ABF materials typically include one or more of an epoxy with a phenol hardener, a cyanate ester with an epoxy, or a cyanate ester with a thermosetting olefin. For example, both BU-GC and such ABF materials can offer line space patternability of approximately 5/5LS for copper at a thickness of 8 microns. Additionally, both (fiber-free) ABF and BU-GC are formed with a lamination and cure process which is milder than the conditions required for at least some prepreg dielectrics. BU-GC materials suitable for use in forming substrates as described in the example embodiments herein, include such materials that may be patterned at a line spacing of at least 10/10LS for copper at a thickness of 8 microns, and that may be used in a lamination process within a substrate, with a cure temperature of 180° C. or less.

Referring now to FIG. 1A, therein is depicted an example microelectronic device in the form of an embedded die substrate 100. Embedded die substrate 100 includes a central core indicated generally at 102, including a dielectric matrix (often fiber-containing) 104 with patterned copper (or other metal) cladding 106a, 106b, on opposite sides, and with through hole interconnects 108a, 108b extending through the dielectric matrix 104 to interconnect regions of patterned copper 106a, 106b.

Substrate 100 includes four build-up layers extending above the core, as indicated at 110, 112, 114, and 116. Each build-up layer 110, 112, 114, 116, has an associated metal layer M1, M2, M3, M4 formed thereon, and filling contacts within the underlying build-up layer, as indicated for M1, at 118, for M2 at 120a, 120b, for M3 at 122, and for M4 at 124a, 124b. The depicted configuration of four build-up layers and four corresponding metal layers is illustrative only, and either a lesser or greater number of build-up layers and metal layers can be utilized. In many examples, an embedded die substrate may include 6-10, or even more build-up layers to one or both sides of a core.

Build-up layers 110, 112 may be formed of a fiber-free dielectric material, which facilitates greater density of contact spacing, as discussed above. In the depicted example build-up layer 112 supports embedded die 126. The term "supports the embedded die" is used herein to identify the build-up layer most closely underlying the embedded die, which is also a layer to which the embedded die is commonly coupled (directly or indirectly) during manufacture, such as by use of an adhesive, as indicated in the example, at 128.

In the depicted example, embedded die 126 is located within a recess 130 formed in build-up layer 114, which in this example is formed of a fiber-containing material, in one example placement of such material within an embedded die substrate. Build-up layer 114 therefore surrounds embedded die 126, as discussed earlier herein. In one example of manufacturing, recess 130 will be formed by removing a portion of a continuous material placed to form build-up layer 114, such as by laser drilling or etching. In other examples, material forming build-up layer 114 may be configured and/or placed to define recess 130 without requiring such removal.

In the depicted example, embedded die 126 is placed within recess 130, and is adhesively coupled to a portion of metal layer M2 supported by build-up layer 112. Subsequently, fiber-free build-up layer 116 is formed, to not only form an additional dielectric layer above fiber-containing build-up layer 114, but also to fill remaining space within recess 130 around embedded die 126. Build-up layer 116 being fiber-free facilitates contacts 132a, 132b, 132c, to be formed at smaller pitch than would be feasible if such layer was fiber-containing and formed of a material such as prepreg, which can present limitations on patterning, as discussed above. As a result, build-up layer 116 does not present a constraint on the configurations of embedded die 126 or the contacts to embedded die 126. As a result, the example configuration can be constructed with fiber-containing materials, such as prepreg, that may not offer patternability at the same resolution of the fiber-free layers. Thus, a broader range of materials may be used for the fiber-containing layers in such a configuration.

In some examples, build-up layer 116 can be patterned at a single time to form the openings for contacts 132a, 132b, 132c and the openings for contacts 124a, 124b. In other examples, openings for contacts 132a, 132b, 132c can be patterned separately, such as by laser drilling, to better accommodate variable placement of embedded die 126 within recess 130 and/or additional depth required for 132a, 132b, 132c relative to that required for contacts 124a, 124b. After formation of contacts 132a, 132b, 132c, a protective coating, such as solder resist 134 can be applied over M4 except in the regions to be used as contact pads for connection to other devices.

Figure 1B:
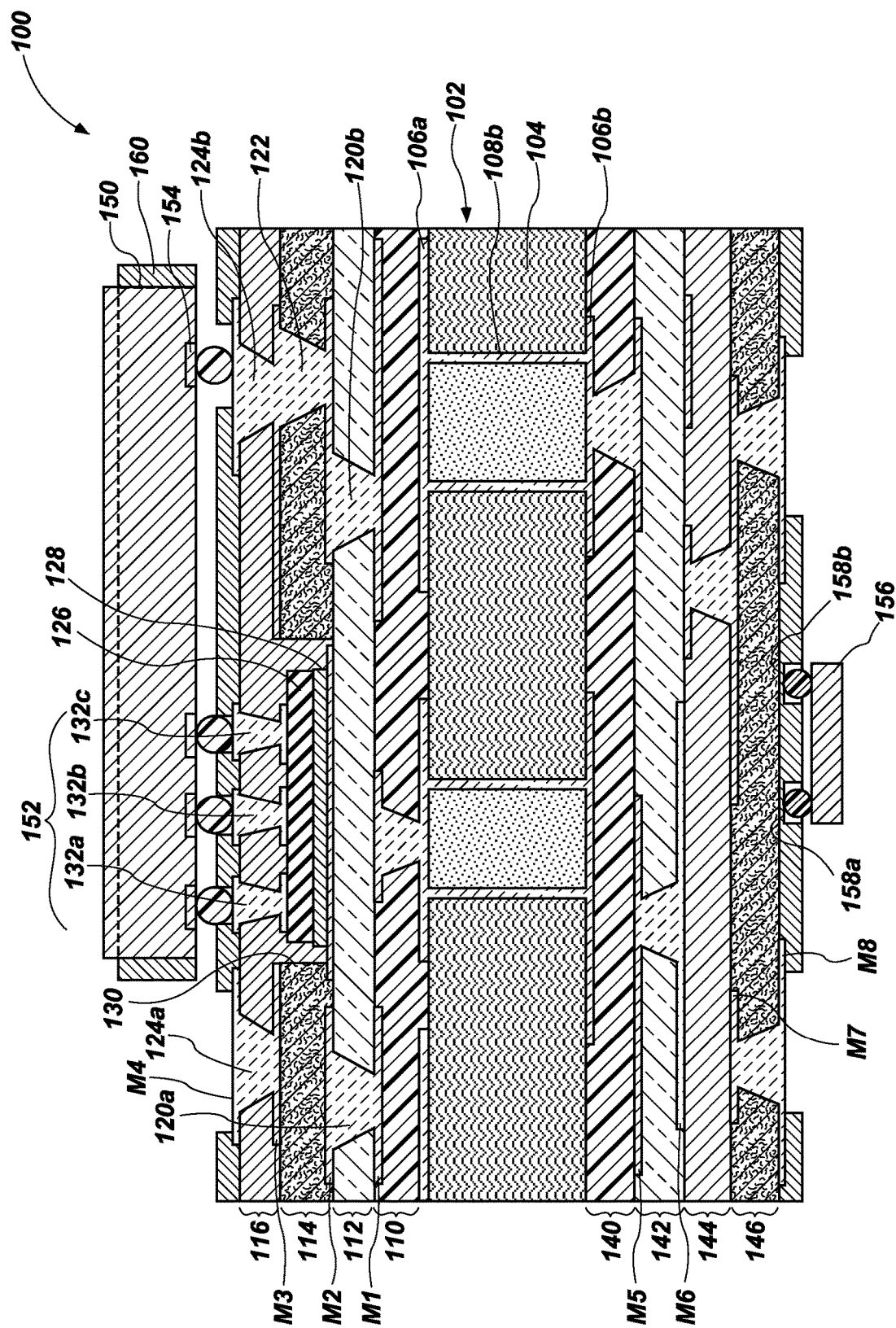

On the opposite side of core 102, again multiple build-up layers are formed, as indicated at 140, 142, 144, 146, each with a respective metal layer M5, M6, M7, M8, respectively (also forming contacts through the associated build-up layer). In the depicted example, build-up layers 140, 142, and 144 include a fiber-free dielectric, while build-up layer 146 is formed with a fiber-containing dielectric, which may be the same as that used for fiber-containing dielectric 114, or may be of a different fiber-containing dielectric. In the depicted example, fiber-containing dielectric 146 is provided to provide increased resistance to cracking to more reliably allow connecting an additional structure external to the lower surface of substrate 100. For example, in some embodiments it may be desirable to include a decoupling (or "bypass") capacitor on the backside of the substrate (and/or the backside of any package containing the substrate) (conventionally termed a "land side capacitor ("LCS"), as depicted in FIG. 1B. As the localized mass of such a land side capacitor can place mechanical strain on the closest layers (in the present example build-up layer 146 and M8), particularly under harsh conditions, the extra strength provided by fiber-containing build-up layer 146 may be expected to provide increased mechanical strength and reliability.

Referring now to FIG. 1B, the figure depicts the embedded die substrate 100 of FIG. 1A, with the further addition of an external semiconductor die 150, which includes a first set of contacts, represented by contacts 152a, 152b, 152c, individually coupled to respective contacts 136a, 136b, 136c, extending to embedded die 126. In the depicted example, a semiconductor die 150 includes an additional contact 154 extending to contact 124b. As noted previously herein, in some examples, the embedded die 126 can establish interconnections between multiple surface-mounted die. For example, embedded die 126 may be further connected to a second surface-mounted die 160 (depicted behind surface-mounted die 150 relative to the plane of the figure). Connections between embedded die 126 and the second surface-mounted die 160 may be formed in the same manner as described in reference to connections between surface die 150 and embedded die 126.

As will be appreciated by persons skilled in the art having the benefit of this disclosure, the depicted and discussed contacts are a representative indicator of many more contacts between semiconductor die 150 and in underlying substrate such as substrate 100 in an actual microelectronic device. Additionally, in the depicted example, a land side capacitor 156 has been attached to contacts 158a, 158b in M8. In some examples, additional coupling, such as through an adhesive connection, may be used to secure a land side capacitor 156 to substrate 100. In the depicted example, connections between each of semiconductor die 150 and land side capacitor with substrate 100 are depicted as being made through contact balls. However, any suitable connecting structure, including conductive pillars or different forms of solder-based connections, or other alternatives may be used in place of the depicted contact balls.

Figure 2:
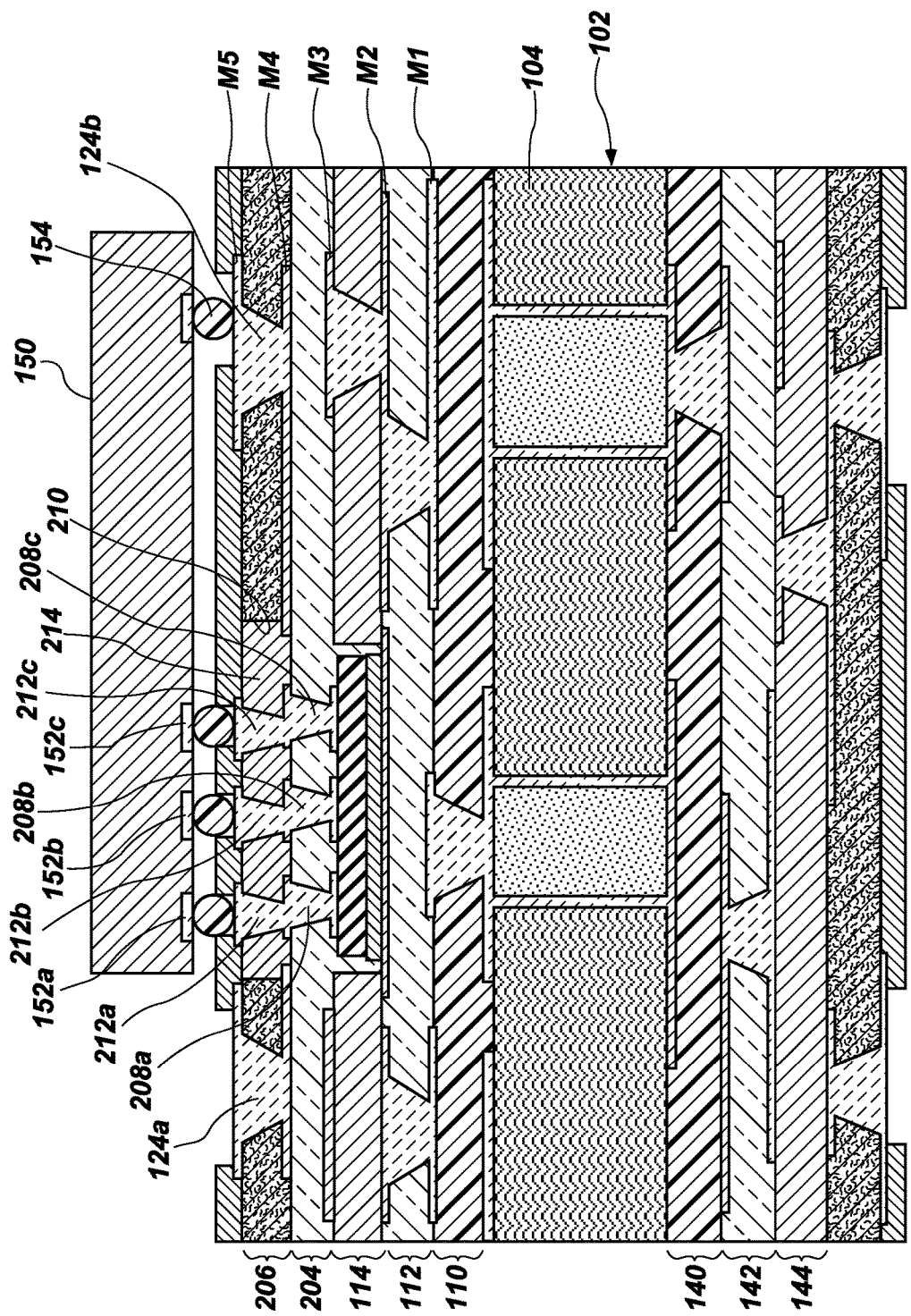
FIG. 2 depicts a simplified cross sectional representation of a microelectronic device incorporating an example alternative structure for the substrate.

Referring now to FIG. 2, the figure depicts an alternative microelectronic device 200 including a different configuration of embedded die substrate 202, relative to that discussed above regarding embedded die substrate 100. Many of the structural features of substrate 202 are directly analogous to structural features of substrate 100, and therefore numbers of such analogous structural features have been carried over to substrate 202. Specifically, the structure of core 102 and of build-up layers 110 and 112 above core 102 are directly analogous to the corresponding structures of embedded die substrate 100; and the structure of build-up layers 140, 142, and 144 extending below core 102 are also directly analogous to the corresponding structures of embedded die substrate 100. Additionally, the identification of metal layers M1, M2, M3, M4, M5, M6, M7, and M8 is carried over, with some minor distinctions over the prior embodiment noted herein.

In contrast to the prior embodiment, in substrate 202, the build-up layer surrounding embedded die 126, and in which recess 130 is formed, identified at 204, is formed of a fiber-free build-up material; and the build-up layer 206, located outward from the build-up layer surrounding embedded die 126, is a fiber-containing layer. Because build-up layer 204 is a fiber-free layer, contacts 208a, 208b, 208c at a relatively narrow pitch to conform to contact spacing on embedded die 126 may be formed as a part of M3. However, as discussed earlier herein, depending on the fiber-containing build-up material selected, the minimum contact spacing through a fiber-containing layer can be restricted relative to minimum spacing achievable through a fiber-free layer, and thus in some examples, placement of a fiber-containing layer above an embedded die will be inconsistent with an optimal contact spacing to connect with embedded die 126. Substrate 202 can be implemented with any of the fiber-containing build-up materials discussed earlier in this description.

Fiber-containing layer 206 is formed to define a recess 210 extending above embedded die 126 and contacts 208a, 208b, 208c. As described previously, build-up layer 206 may be formed as a continuous layer and subsequently patterned, such as by laser etching, to form recess 210; or alternatively may be formed of a material configured and/or placed to define recess 210. Recess 210 will be filled with a fiber-free dielectric 214 to facilitate forming of contacts 212a, 212b, 212c at a pitch matching that of contacts 208a, 208b, 208c, and of contacts 152a, 152b, 152c of semiconductor die 150. Alternatively, the size of recess 210 may be enlarged relative to the depiction in FIG. 2 to allow redistribution of contacts through build-up layer 206 (with accompanying adaptation of M3), to adjust to a difference in pitch spacing between contacts 208a, 208b, 208c (corresponding to that of contacts on embedded die 126) to a different pitch for contacts 152a, 152b, 152c of semiconductor die 150. In some examples, recess 210 will be filled with fiber free dielectric 214 prior to patterning of build-up layer 206 to facilitate a single patterning operation on build-up layer 206, followed by deposition of M4, to form all of contacts 124a, 124b, and 212a, 212b, 212c.

In the build-up layers extending below core 102, build-up layers 140, 142, and 144 are the same as discussed relative to embedded die substrate 100. In the depicted example, however, build-up layer 146 is formed of fiber-free material, like build-up layers 140, 142, and 144.

Once construction of embedded die substrate 202 is complete, semiconductor die 150 will be coupled to contacts 212a, 212b, 212c, and contact 154, through contact balls or other appropriate structures, as discussed earlier herein.

Figure 3:
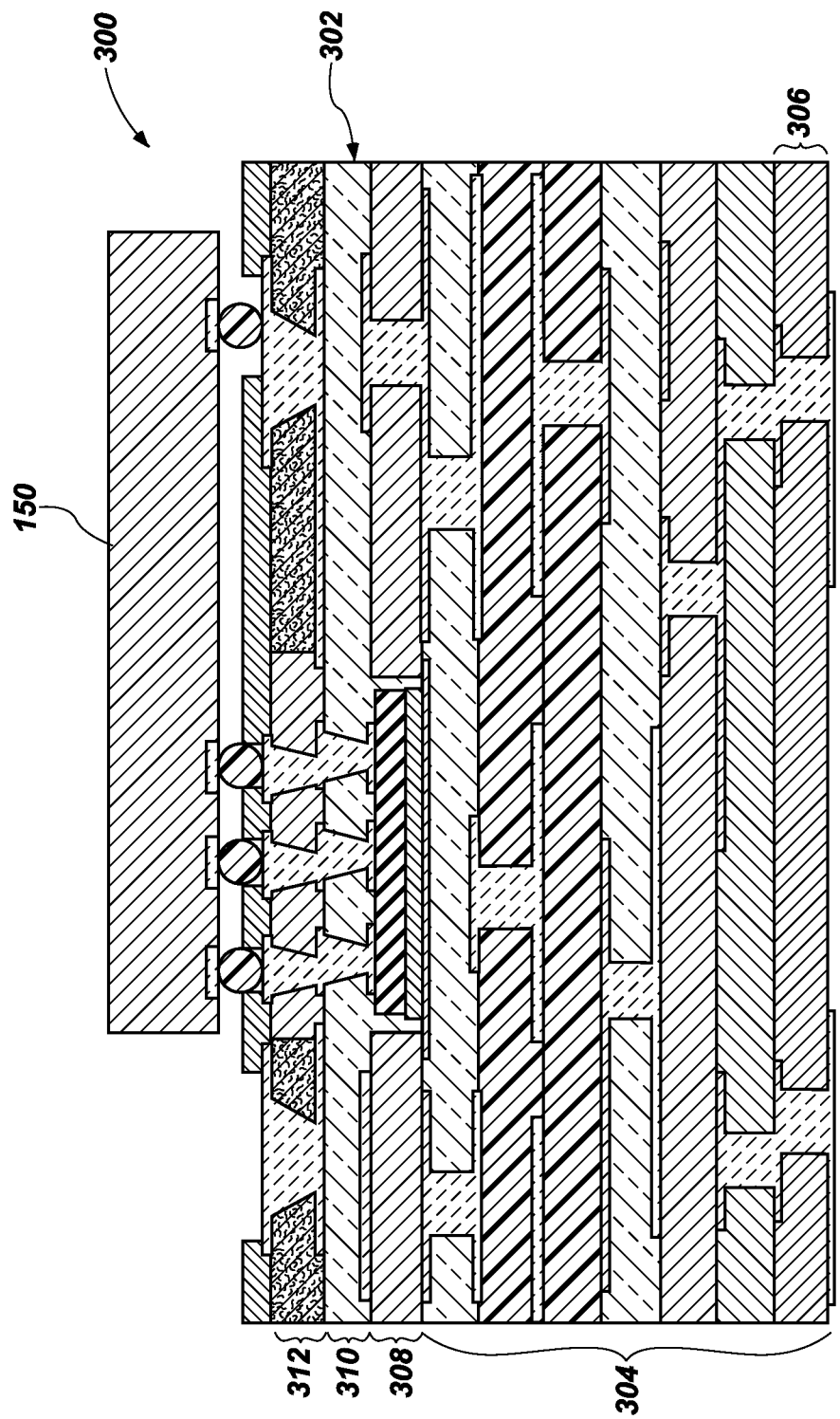
FIG. 3 depicts a simplified cross-sectional representation of another alternative structure for the embedded die substrate, including a coreless substrate.

Referring now to FIG. 3, therein is depicted an alternative configuration of a microelectronic device 300, formed using a coreless substrate 302. As will be apparent to persons skilled in the art, in place of multiple layers being deposited on opposite sides of a central (or generally central) core, a coreless substrate is constructed from a bottom layer upwardly. As the construction of a coreless substrate is well known to persons skilled in the art, the specifics of construction of the substrate will not be addressed here except to note that, as indicated at 304, the example coreless substrate 302 includes seven build-up layers underlying an embedded die 126. In some examples, all such build-up layers underlying embedded die 126 may be formed of a fiber-free dielectric. In other examples, the lowermost build-up layer 306 (in most examples, the build-up layer furthest from the embedded die), may be formed of a fiber-containing material to provide reinforcement for attachment of a land side capacitor as discussed relative to FIGS. 1A-1B.

In the depicted example the structures and methods of forming of build-up layer 308, extending around embedded die 126, and of build-up layers 310 and 312 extending above embedded die 126, are directly analogous to build-up layers 114, 204, and 206 of FIG. 2, and thus are not repeated here.

Figure 4:
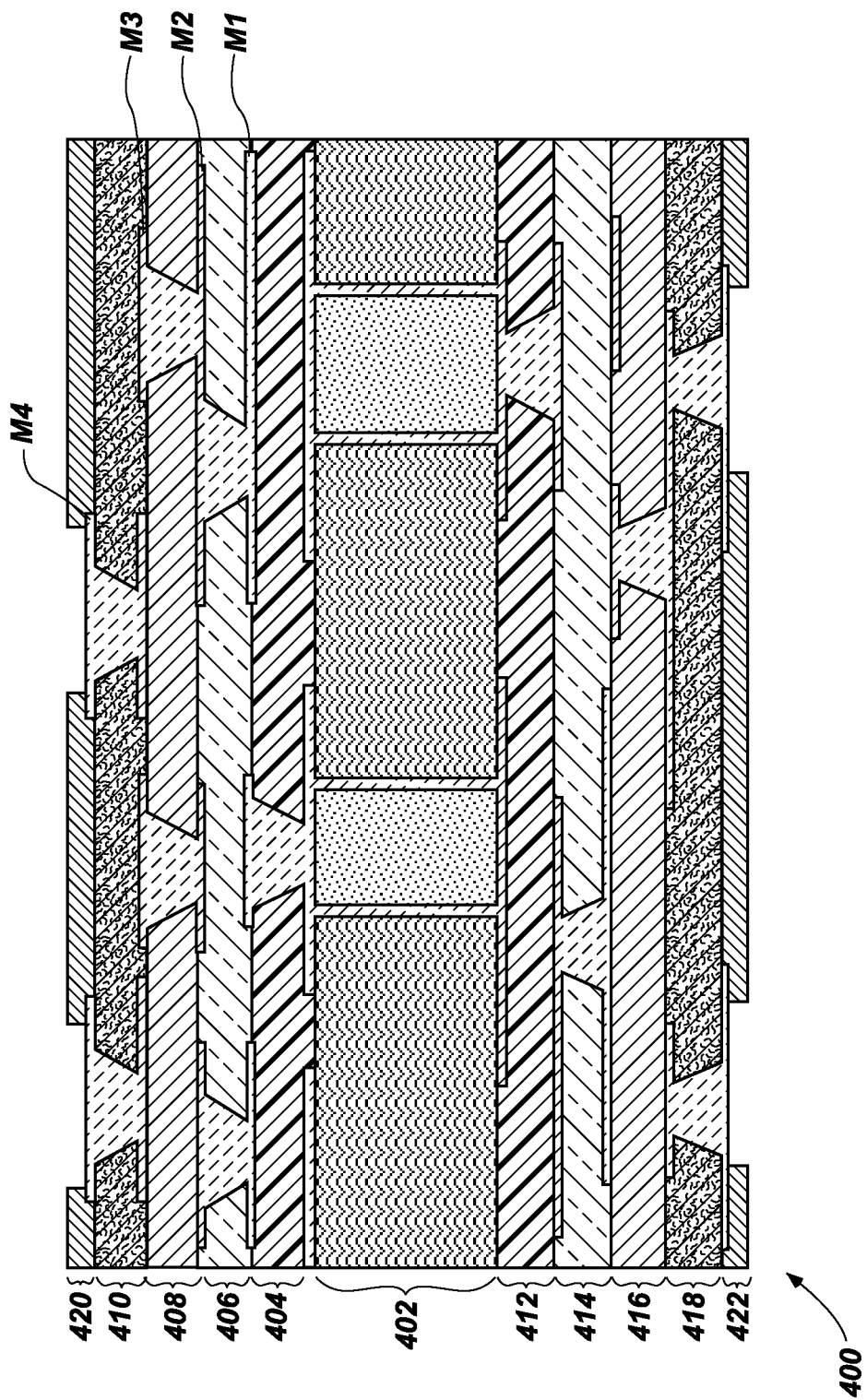
FIG. 4 depicts a simplified cross-sectional representation of a substrate formed with one or more layers of a selected fiber-containing dielectric material buildup layers.

Referring now to FIG. 4, the figure depicts a simplified cross-sectional representation of an example substrate 400, which is not an non-embedded die substrate. Embedded die substrate 400 is analogous in many respects to the embedded die substrate of FIG. 2 in general structure. For example, substrate 400 includes a central core structure 402 comparable to core 102 of FIG. 2, and includes buildup layers 412, 414, 416 (and accompanying metal layers) below core 402, which can be directly comparable to buildup layers 140, 142 and 144 of FIGS. 1A-B and 2. A lowermost buildup layer 416 (and accompanying metal layer) will be a fiber-containing layer formed of BU-CG, discussed in more detail below. Similarly, substrate 400 includes three buildup layers 404, 406, and 408, above core 402, each supporting a respective metal layer M1, M2, and M3. Each of buildup layers 404, 406, and 408 in this example will be a fiber-free buildup layer. Build-up layer 410, like build-up layer 416, will be a fiber-containing layer formed of BU-GC (supporting metal layer M4).

Substrate 400 is an example configuration of a substrate in which each buildup layer is to be capable of being patterned in a similar manner at relatively fine line spacings (which is not possible with a prepreg material, as discussed earlier herein). BU-GC buildup layers 410 and 416 provide that functionality, while also requiring milder processing, thereby providing a greater range of materials that can be used for relatively inward structures/layers. As a result, inclusion of one or both outermost BU-GC buildup layers 410, 416 will provide crack and delamination resistance at the surface of the substrate adjacent such buildup layer(s); while also reducing the risk of the embrittling the substrate relative to the use of prepreg material. As discussed relative to FIG. 1A, a semiconductor die can be coupled to the contacts formed by M4; and in some examples, an external device, such as a land side capacitor, can be coupled to contacts of the lowermost metal layer.

Figure 5:
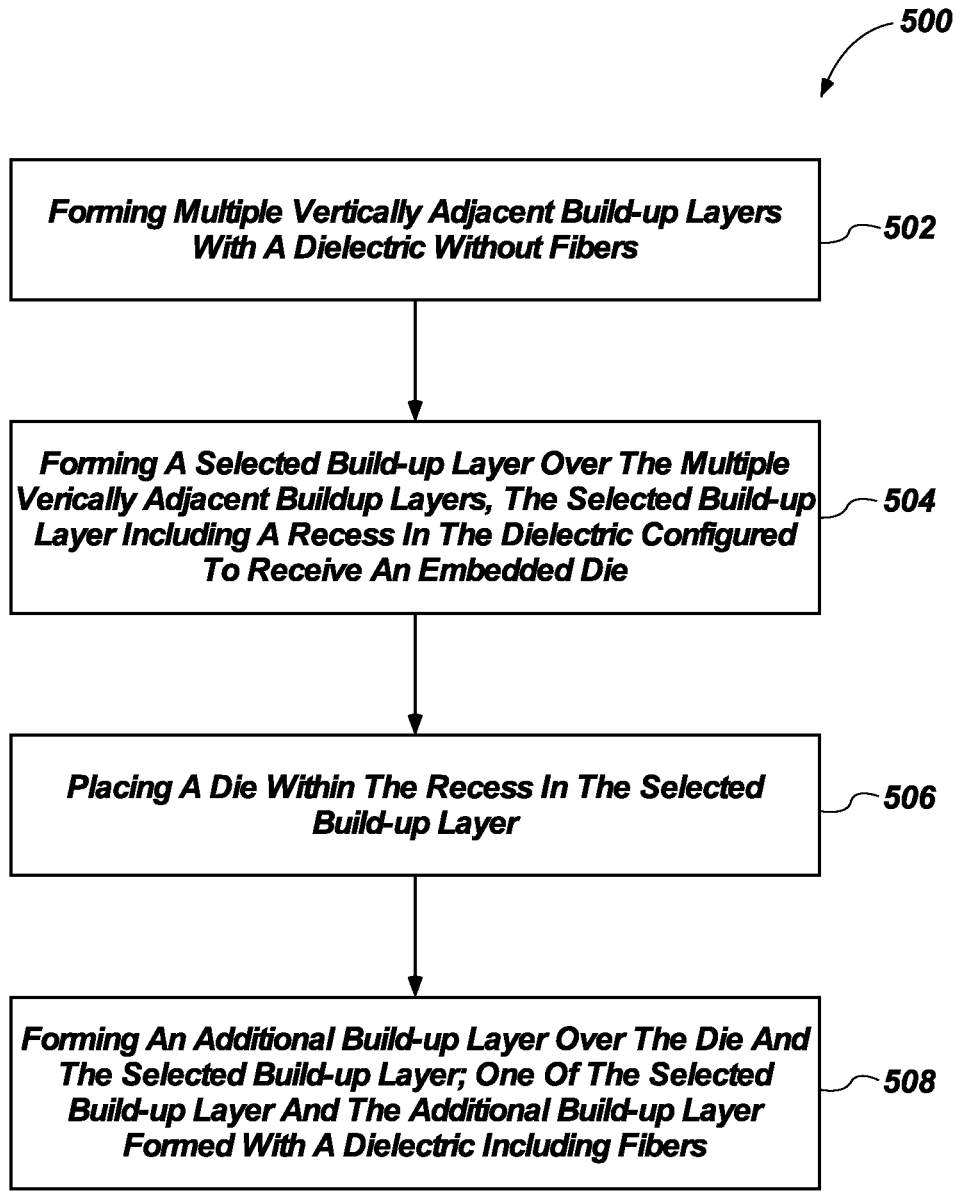
FIG. 5 is a flowchart of an example method for forming a microelectronic device through use of the techniques and structures described herein.

Referring now to FIG. 5, the figure depicts a flowchart of an example method 500 of forming a microelectronic device including an embedded die substrate having at least one fiber-containing build-up layer in accordance with the above description. As indicated in 502, the method includes forming multiple vertically adjacent build-up layers of a substrate with a fiber-free dielectric. As discussed relative to the prior figures, these multiple vertically adjacent build-up layers can be portions of a cored substrate or a coreless substrate.

As indicated at 505, in a selected build-up layer a recess is formed to accommodate receiving an embedded die. The term "selected build-up layer" is used herein to distinguish the build-up layer having the embedded die-receiving recess from other build-up layers. In some examples, an embedded die-receiving recess may extend vertically through multiple build-up layers, in which case the term "selected build-up layer" is intended to refer to the outermost build-up layer defining the recess (i.e., that closest to the most closely adjacent surface of the substrate). Similarly, the term "additional build-up layer" is used herein to refer to a build-up layer located above (outward from) the "selected build-up layer" (i.e. closer to the most closely adjacent surface of the substrate being formed). This the terms "selected" and "additional" are used only as references to specific build-up layers, and do not suggest any other process or condition. As noted previously herein, the selected build-up layer may be formed initially with the recess, or the selected build-up layer may be formed as a continuous surface, and the recess formed by etching, laser drilling, etc.

As indicated at 506, the die being embedded is placed within the recess in the selected build-up layer. And as indicated at 508, an additional build-up layer is formed over the die and the selected build-up layer, wherein one of the selected build-up layer and the additional build-up layer is formed with a dielectric containing fibers. As discussed relative to FIG. 2, when the selected build-up layer (surrounding the embedded die) is the fiber-containing build-up layer, in many examples the subsequently formed "additional build-up layer" will be formed of a fiber-free dielectric. And when the additional build-up layer is formed of the fiber-containing material, in many examples, the method will further include forming a recess in the additional build-up layer above the embedded die, and filling that recess with a fiber-free dielectric material.

Figure 6:
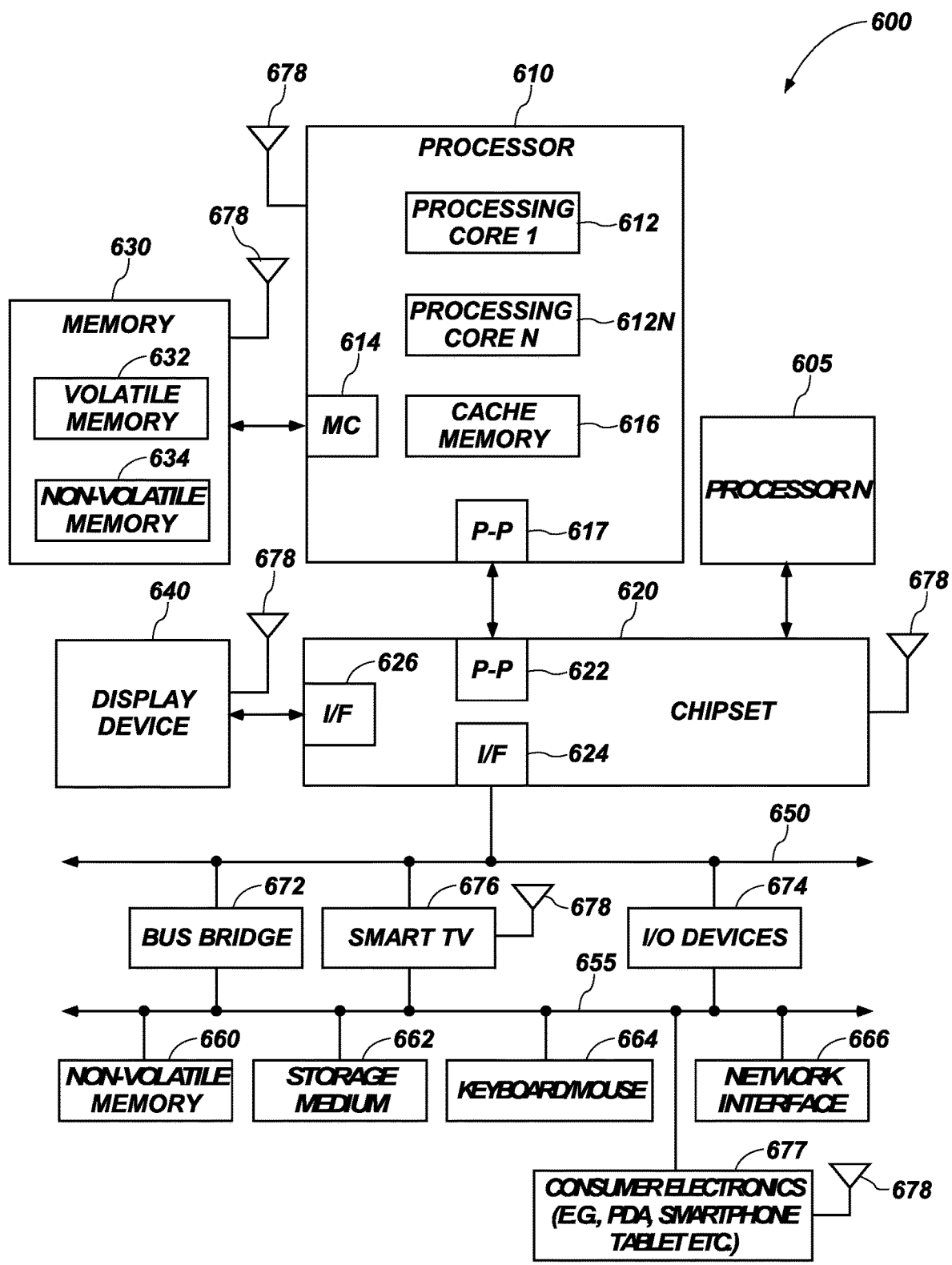
FIG. 6 depicts a system level diagram of an electronic system which may incorporate an embedded die microelectronic device such as any of the microelectronic devices as described herein.

FIG. 6 illustrates a system level diagram, according to one embodiment of the invention. For instance, FIG. 6 depicts an example of an electronic device (e.g., system) including one or more microelectronic devices including a substrate including at least one fiber-containing buildup layer, as described herein, and which in some examples may be an embedded die substrate. FIG. 6 is included to show an example of a higher level device application for the present invention. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 is a system on a chip (SOC) system.

In one embodiment, processor 610 has one or more processing cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the invention, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices 672, 676, 674, 660, 662, 664, 666, 677, etc. Chipset 620 may also be coupled to a wireless antenna 678 to communicate with any device configured to transmit and/or receive wireless signals.

Chipset 620 connects to display device 640 via interface 626. Display 640 may be, for example, a liquid crystal display (LCD), a plasma display, cathode ray tube (CRT) display, or any other form of visual display device. In some embodiments of the invention, processor 610 and chipset 620 are merged into a single SOC. In addition, chipset 620 connects to one or more buses 650 and 655 that interconnect various elements 674, 660, 662, 664, and 666. Buses 650 and 655 may be interconnected together via a bus bridge 672. In one embodiment, chipset 620 couples with a non-volatile memory 660, a mass storage device(s) 662, a keyboard/mouse 664, and a network interface 666 via interface 624 and/or 604, smart TV 676, consumer electronics 677, etc.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the methods and apparatuses described herein, a non-limiting set of Example embodiments are set forth below as numerically identified Examples.

Example 1 is a microelectronic device, including: a substrate including multiple build-up layers, each build-up layer including a dielectric and supporting an associated conductive layer extending over the dielectric and forming contacts extending through the dielectric; and an embedded die extending within a recess in a selected build-up layer; wherein at least one of the selected build-up layer and an additional build-up layer located outward of the selected build-up layer includes a dielectric including fibers, and wherein multiple adjacent build-up layers located inward from the selected build-up layer each include a dielectric without fibers.

In Example 2, the subject matter of Example 1 wherein the selected build-up layer forming the recess includes a dielectric including fibers.

In Example 3, the subject matter of Example 2 wherein one or more build-up layers located outward of the selected build-up layer includes dielectric without fibers.

In Example 4, the subject matter of any one or more of Examples 1-3 wherein the selected build-up layer including the recess includes a dielectric without fibers, and wherein an additional build-up layer extending outward of the selected build-up layer includes a dielectric including glass fibers.

In Example 5, the subject matter of any one or more of Examples 1-4 wherein the substrate includes a core, and wherein all build-up layers located between a first side of the core and the selected build-up layer include a dielectric without fibers.

In Example 6, the subject matter of any one or more of Examples 1-5 wherein the fibers comprise glass fibers.

In Example 7, the subject matter of any one or more of Examples 1-6 wherein the dielectric including fibers comprises a prepreg material.

In Example 8, the subject matter of any one or more of Examples 1-7 wherein the dielectric including fibers comprises a build-up material with glass cloth.

In Example 9, the subject matter of any one or more of Examples 1-8 wherein the substrate is a coreless substrate.

In Example 10, the subject matter of any one or more of Examples 2-9 wherein the embedded die is housed within a recess formed in the dielectric of the selected build-up layer.

In Example 11, the subject matter of any one or more of Examples 4-10 wherein the additional build-up layer dielectric with glass fibers defines an open region above the embedded die and wherein the open region is filled with a dielectric without fibers.

In Example 12, the subject matter of any one or more of Examples 1-11 optionally include a first external die coupled to the substrate, and electrically coupled to the embedded die.

In Example 13, the subject matter of Example 12, optionally including a second external die coupled to the substrate and electrically coupled to the embedded die, and wherein the embedded die is a bridge die interconnecting the first and second external die.

In Example 14, the subject matter of Example 13 wherein electrical contacts formed in the build-up layer including fibers are placed at a first minimum pitch; and wherein electrical contacts to the embedded die are placed at a second minimum pitch, the second minimum pitch smaller than the first minimum pitch.

Example 15 is a microelectronic device, including: a substrate including multiple build-up layers, each build-up layer including a dielectric and supporting an associated conductive layer extending over the dielectric and forming contacts extending through the dielectric; and wherein at least a first outermost buildup layer of the substrate is formed of a material including build-up material with glass cloth; and wherein multiple adjacent build-up layers located inward from the outermost build-up layer each include a dielectric without fibers.

In Example 16, the subject matter of Example 15 wherein a second outermost buildup layer on an opposite side of the substrate is formed of a material including build-up material with glass cloth.

Example 17 is a method of forming a microelectronic device, including: sequentially forming multiple build-up layers on one another to form a multi-layer substrate, each build-up layer including a dielectric and an associated conductive layer extending over the dielectric and forming contacts extending through the dielectric, including, forming a first group of multiple vertically adjacent build-up layers including respective dielectric materials without fibers, forming a selected build-up layer over the multiple vertically adjacent build-up layers, the selected build-up layer including a recess in the dielectric configured to receive an embedded die, and forming an additional build-up layer over the selected build-up layer, wherein one of the selected build-up layer and the additional build-up layer is formed with a dielectric including fibers; and placing a die within the recess in the selected build-up layer prior to forming the additional build-up layer.

In Example 18, the subject matter of Example 17 wherein the selected build-up layer surrounding the embedded die is formed with the dielectric including glass fibers.

In Example 19, the subject matter of Example 18 wherein the additional build-up layer located outward of the selected build-up layer is formed with a dielectric without fibers.

In Example 20, the subject matter of any one or more of Examples 17-19 wherein the dielectric including fibers comprises a prepreg material.

In Example 21, the subject matter of any one or more of Examples 17-20 wherein the dielectric including fibers comprises build-up film with glass cloth.

In Example 22, the subject matter of any one or more of Examples 17-21 wherein the selected build-up layer surrounding the embedded die is formed with a dielectric without fibers, and wherein the additional build-up layer extending outward of the selected build-up layer is formed with a dielectric including glass fibers.

In Example 23, the subject matter of any one or more of Examples 17-22 wherein the substrate includes a core, and wherein the first group of multiple vertically adjacent build-up layers is formed over a first side of the core; and wherein the selected build-up layer is formed with a dielectric without fibers.

In Example 24, the subject matter of Example 23 optionally includes forming multiple build-up layers on the second side of the core.

In Example 25, the subject matter of any one or more of Examples 23-24 wherein an equal number of build-up layers are formed on each of the first and second sides of the core, and wherein respective build-up layers to each side of the core are formed with the same dielectric compound.

In Example 26, the subject matter of any one or more of Examples 17-25 wherein the substrate is a coreless substrate.

In Example 27, the subject matter of Example 26 optionally includes forming a first build-up layer including a dielectric including fibers, and forming the first group of vertically adjacent multiple build-up layers over the first build-up layer including fibers.

In Example 28, the subject matter of any one or more of Examples 22-27 wherein the additional build-up layer dielectric with fibers defines an open region above the embedded die and wherein the open region is filled with a dielectric without fibers.

In Example 29, the subject matter of any one or more of Examples 17-28 optionally include coupling an external die to the substrate and in electrical communication through die contacts with the embedded die.

In Example 30, the subject matter of Example 29 wherein electrical contacts formed in the build-up layer including fibers are placed at a first minimum pitch; and wherein die contacts to the embedded die are placed at a second minimum pitch, the second minimum pitch smaller than the first minimum pitch.

Example 31 is a method of forming a microelectronic device, including: sequentially forming multiple build-up layers on one another to form a multi-layer substrate, each build-up layer including a dielectric and an associated conductive layer extending over the dielectric and forming contacts extending through the dielectric, including, forming a first group of multiple vertically adjacent build-up layers including respective dielectric materials without fibers, and forming an first outermost build-up layer over the multiple vertically adjacent build-up layers, the outermost buildup layer formed of a build-up material with glass cloth.

In Example 32, the subject matter of Example 31 optionally includes forming a second outermost buildup layer on the opposite side of the substrate from the first outermost buildup layer of build-up material with glass cloth.

Example 33 is an electronic system, including: a microelectronic device, including, a substrate including, multiple build-up layers, each build-up layer including a dielectric, and supporting an associated conductive layer extending over the dielectric and forming contacts extending through the dielectric; and an embedded die extending within a recess in a selected build-up layer; wherein at least one of the selected build-up layer and an additional build-up layer located outward of the selected build-up layer includes a dielectric including fibers, and wherein multiple adjacent build-up layers located inward from the selected build-up layer each include a dielectric without fibers; and a surface semiconductor die extending above the substrate and electrically coupled to the embedded die; at least one of another microelectronic device, a mass storage device and a network interface operably coupled to the microelectronic device.

In Example 34, the subject matter of Example 33 wherein the dielectric including fibers comprises glass fibers in an organic matrix.

In Example 35, the microelectronic devices of any one or more of Examples 1-14, are manufactured in accordance with the methods of any one or more of Examples 17-30.

In Example 36, the electronic systems of either of Examples 33 and 34 incorporate a microelectronic device in accordance with any one or more of Examples 1-14.

In Example 37, in the electronic systems of either of Examples 33 and 34, the included microelectronic device is manufactured in accordance with the methods of any one or more of Examples 17-20.

In Example 38, the microelectronic devices of either of Examples 15-16 are constructed in accordance with the methods of either of Examples 31-32.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A microelectronic device, comprising:
   a substrate comprising multiple build-up layers, each build-up layer including a dielectric and supporting an associated conductive layer extending over the dielectric and forming contacts extending through the dielectric; and
   an embedded die extending within a recess in a selected build-up layer, the embedded die electrically engaging contacts of an adjacent build-up layer, wherein the contacts of the adjacent build-up layer that engage the embedded die are located within a dielectric without fibers;
   wherein at least one of the selected build-up layer and an additional build-up layer located outward of the selected build-up layer includes a dielectric comprising fibers, and
   wherein multiple build-up layers located inward from the selected build-up layer each include a dielectric without fibers.

2. The microelectronic device of claim 1, wherein the selected build-up layer forming the recess includes a dielectric comprising fibers.

3. The microelectronic device of claim 2, wherein one or more build-up layers located outward of the selected build-up layer includes dielectric without fibers.

4. The microelectronic device of claim 1, wherein the selected build-up layer including the recess includes a dielectric without, fibers, and wherein an additional build-up layer extending outward of the selected build-up layer includes a dielectric comprising glass fibers.

5. The microelectronic device of claim 1, wherein the substrate includes a core, and wherein all build-up layers located between a first side of the core and the selected build-up layer include a dielectric without fibers.

6. The microelectronic device of claim 1, wherein the fibers comprise glass fibers.

7. The microelectronic device of claim 1 wherein the dielectric comprising fibers comprises a prepreg material.

8. The microelectronic device of claim 1 wherein the dielectric comprising fibers comprises a build-up material with glass cloth.

9. The microelectronic device of claim 1, wherein the substrate is a cureless substrate.

10. The microelectronic device of claim 2, wherein the embedded die is housed within a recess formed in the dielectric of the selected build-up layer.

11. The microelectronic device of claim 4, wherein the additional build-up layer dielectric with glass fibers defines an open region above the embedded die and wherein the open region is filled with a dielectric without fibers.

12. The microelectronic device of claim 1, further comprising a first external die coupled to the substrate, and electrically coupled to the embedded die.

13. The microelectronic device of claim 12, further comprising a second external die coupled to the substrate and electrically coupled to the embedded die, and wherein the embedded die is a bridge die interconnecting the first and second external die.

14. The microelectronic device of claim 13, wherein electrical contacts formed in the build-up layer comprising fibers are placed at a first minimum pitch; and wherein electrical contacts to the embedded die are placed at a second minimum pitch, the second minimum pitch smaller than the first minimum pitch.

15. A microelectronic device, comprising:
   a substrate comprising multiple build-up layers, each build-up layer including a dielectric and supporting an associated conductive layer extending over the dielectric and forming contacts extending through the dielectric; and
   wherein at least a first outermost buildup layer of the substrate is formed of a material comprising build-up material with glass cloth;
   wherein multiple adjacent build-up layers located inward from the outermost build-up layer each include a dielectric without fibers; and
   wherein contacts in build-up layers with fibers include contacts spaced at a first minimum pitch, and wherein contacts in build-up layers without fibers include contacts spaced at a second minimum pitch smaller than the first minimum pitch.

16. The microelectronic device of claim 15, wherein a second outermost buildup layer on an opposite side of the substrate is formed of a material comprising build-up material with glass cloth.

17. An electronic system, comprising:
a microelectronic device, comprising,
a substrate comprising,
multiple build-up layers, each build-up layer including a dielectric, and supporting an associated conductive layer extending over the dielectric and forming contacts extending through the dielectric; and
an embedded die extending within a recess in a selected build-up layer, the embedded die electrically engaging contacts of an adjacent build-up layer, wherein the contacts of the adjacent build-up layer that engage the embedded die are located within a dielectric without fibers;
wherein at least one of the selected build-up layer and an additional build-up layer located outward of the selected build-up layer includes a dielectric comprising fibers, and
wherein multiple adjacent build-up layers located inward from the selected build-up layer each include a dielectric without fibers;
a surface semiconductor die extending above the substrate and electrically coupled to the embedded die; and
at least one of another microelectronic device, a mass storage device and a network interface operably coupled to the microelectronic device.

18. The electronic system of claim 17, wherein the dielectric comprising fibers comprises glass fibers in an organic matrix.

* * * * *